United States Patent [19]
Foerstel

[11] Patent Number: 5,845,385
[45] Date of Patent: Dec. 8, 1998

[54] APPARATUS AND METHOD FOR LOADING AN ELECTRONIC COMPONENT INTO A CARRIER

[75] Inventor: Joseph Foerstel, Santa Clara, Calif.

[73] Assignee: Altera Corporation, San Jose, Calif.

[21] Appl. No.: 742,055

[22] Filed: Oct. 31, 1996

Related U.S. Application Data

[60] Provisional application No. 60/024,949 Aug. 30, 1996.

[51] Int. Cl.[6] ................................................. B23P 11/00
[52] U.S. Cl. ........................... 29/464; 29/592.1; 29/740; 29/741
[58] Field of Search .................................. 29/464, 592.1, 29/593, 739, 740, 741, 743; 294/2, 116; 414/618, 626, 627

[56] References Cited

U.S. PATENT DOCUMENTS

| | | | |
|---|---|---|---|
| 4,507,861 | 4/1985 | Sprenkle | 29/741 |
| 4,827,607 | 5/1989 | Korsunsky et al. | 29/740 X |
| 4,860,439 | 8/1989 | Riley | 29/741 |
| 5,301,416 | 4/1994 | Foerstel | 29/593 |
| 5,402,563 | 4/1995 | Satoh et al. | 29/741 X |
| 5,509,193 | 4/1996 | Nuzoll | 29/741 |

FOREIGN PATENT DOCUMENTS 2-180100  7/1990  Japan ...................................... 29/740

*Primary Examiner*—S. Thomas Hughes
*Attorney, Agent, or Firm*—Flehr Hohbach Test Albritton & Herbert LLp; William S. Galliani

[57] ABSTRACT

A method of loading an electronic component into a carrier includes the step of setting an electronic component onto a pedestal including a pedestal post. A carrier with a clip is positioned over the pedestal. The pedestal post is forced against the clip such that the clip is in a retracted position that allows the electronic component to be positioned in the carrier. The pedestal post is then removed from the clip so that the electronic component is secured in the carrier by the clip.

21 Claims, 7 Drawing Sheets

APPARATUS AND METHOD FOR LOADING AN ELECTRONIC COMPONENT INTO A CARRIER

This application claims priority to the provisional application entitled "Apparatus and Method for Loading an Electronic Component into a Carrier", Ser. No. 60/024,949, filed Aug. 30, 1996.

BRIEF DESCRIPTION OF THE INVENTION

This invention relates generally to electronic component carriers that are used to protect electronic components during handling and testing. More particularly, this invention relates to an apparatus and method for loading an electronic component into such a carrier.

BACKGROUND OF THE INVENTION

FIG. 1 illustrates a carrier 10 in accordance with the prior art. The carrier 10 includes a carrier body 12 which defines a central aperture 13 configured to receive an electronic component 14. Slots 16 in the carrier 10 positionally correspond to leads 18 in the electronic component 14. As a consequence, when the electronic component 14 is positioned within the carrier 10, the leads 18 of the electronic component 14 are protected by the carrier 10.

The electronic component 14 is secured within the carrier 10 by a clip 20. The clip 20 includes a set of arms 22A and 22B, which respectively terminate in pivot ends 24A and 24B. The pivot ends 24A and 24B engage corresponding pivot notches 26A and 26B formed in the carrier body 12.

FIG. 1 also illustrates a socket 32. When the electronic component 14 is positioned within the carrier 10 and the carrier 10 is positioned within the socket 32, testing of the electronic device 14 can be performed.

Thus, the carrier 10 operates to protect the leads 18 of the electronic component 14 during handling. In addition, the carrier 10 operates to electrically connect the electronic component 14 to the socket 32 for testing.

The apparatus of FIG. 1 is described in detail in U.S. Pat. No. 5,301,416 (the '416 patent), which is owned by the assignee of this application. The '416 patent is expressly incorporated by reference herein.

The present invention is directed toward improvements upon the technology disclosed in the '416 patent. In particular, the present invention is directed toward providing an automated technique for loading an electronic component 14 into a carrier 10 of the type shown in FIG. 1.

SUMMARY OF THE INVENTION

A method of loading an electronic component into a carrier includes the step of setting an electronic component onto a pedestal including a pedestal post. A carrier with a clip is positioned over the pedestal. The pedestal post is forced against the clip such that the clip is in a retracted position that allows the electronic component to be positioned in the carrier. The pedestal post is then removed from the clip so that the electronic component is secured in the carrier by the clip.

The method of the invention provides an improved technique for loading electronic components into a carrier. The automated technique is less susceptible to electronic component damage than prior art manual loading operations. In addition, the automated technique is much faster than prior art manual loading operations. Advantageously, the technique is compatible with existing carrier devices.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
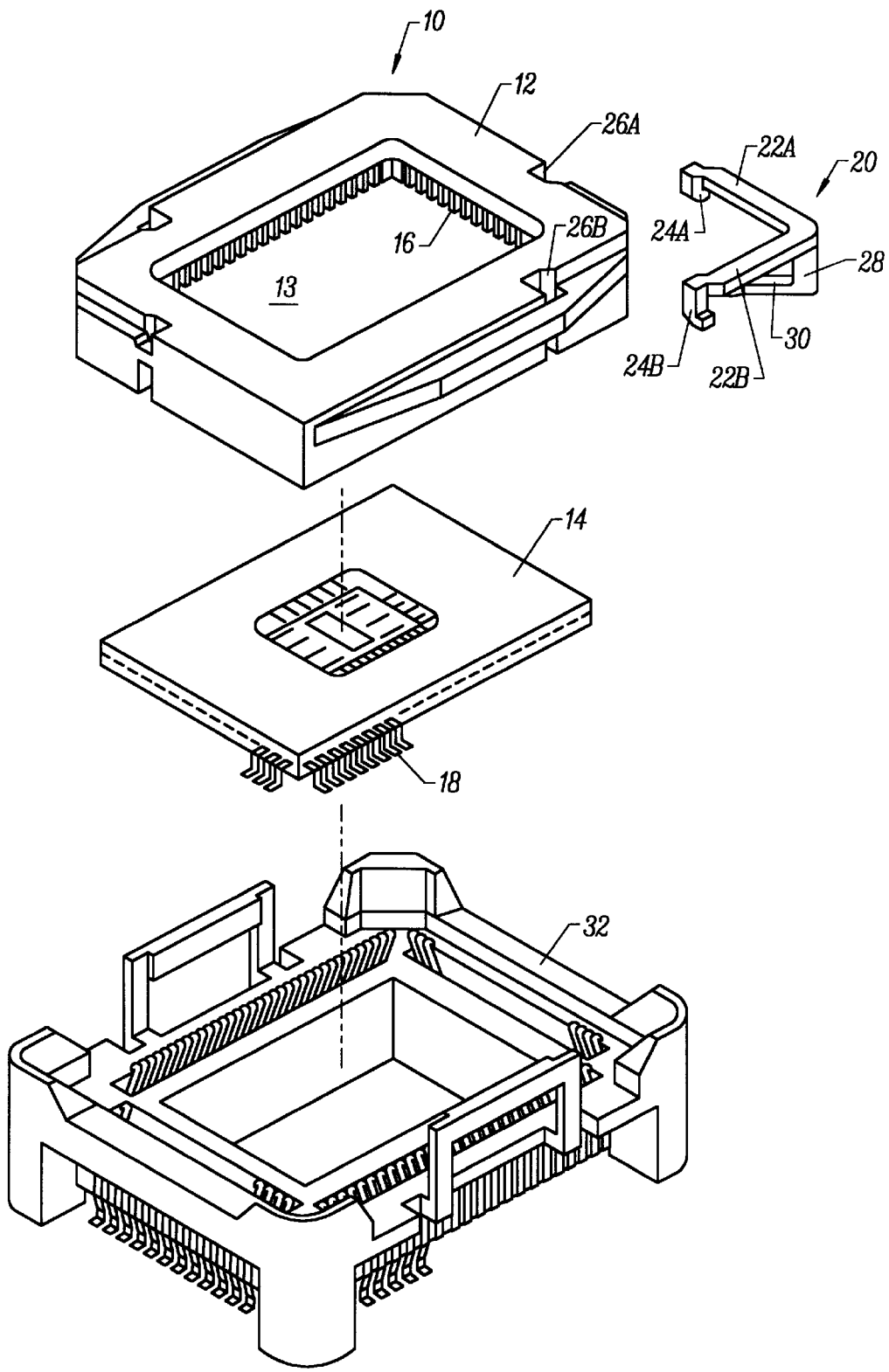
FIG. 1 illustrates a combination carrier, electronic component, and socket configuration in accordance with the prior art.
Figure 2:
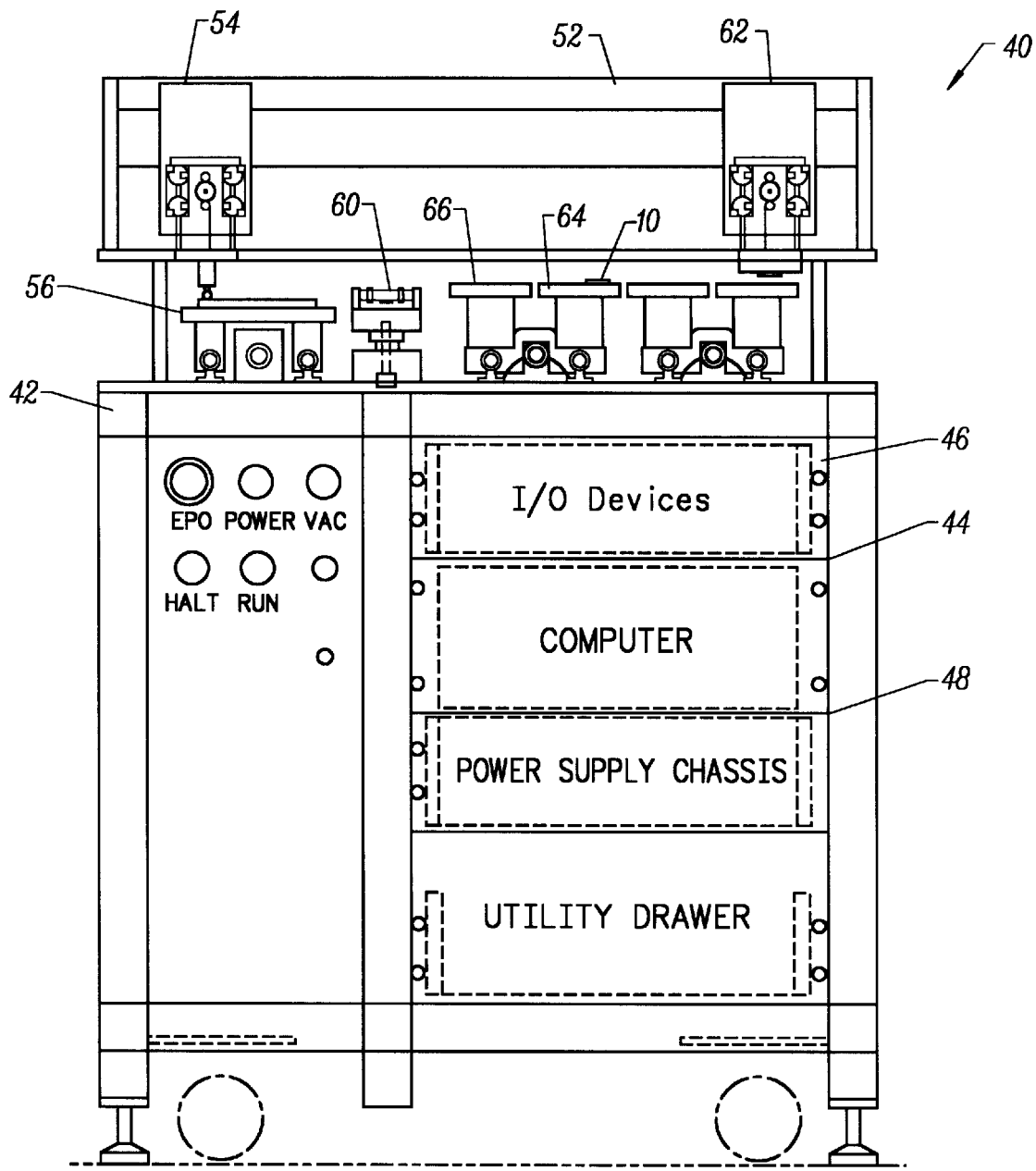
FIG. 2 illustrates a carrier loading apparatus in accordance with an embodiment of the invention.

FIG. 2 illustrates a carrier loading apparatus 40 in accordance with an embodiment of the invention. The apparatus 40 includes a base frame 42 which supports a computer 44, input/output devices 46, and a power supply 48. A device loading assembly 52 is controlled by the computer 44 through the input/output devices 46. An electronic component handling mechanism 54 is used to lift an electronic component 14 from an electronic component tray 56. The electronic component handling mechanism 54 moves the electronic component 14 from the tray 56 to a mounting pedestal 60. Thereafter, a carrier handling mechanism 62 lifts a carrier 10 from a carrier tray 64. As will be described below, the carrier handling mechanism 62 is operated in conjunction with the mounting pedestal 60 to load the electronic component 14 into the carrier 10. Thereafter, the carrier handling mechanism 62 delivers the loaded carrier to an output tray 66.

Preferably, the electronic component handling mechanism 54 and the carrier handling mechanism 62 respectively manipulate the electronic component 14 and carrier 10 using vacuum wand techniques known in the art. The electronic component handling mechanism 54 and the carrier handling mechanism 62 are controlled by computer 48, via the input output devices 44. Computer positional control of this type is known in the art.

Figure 3:
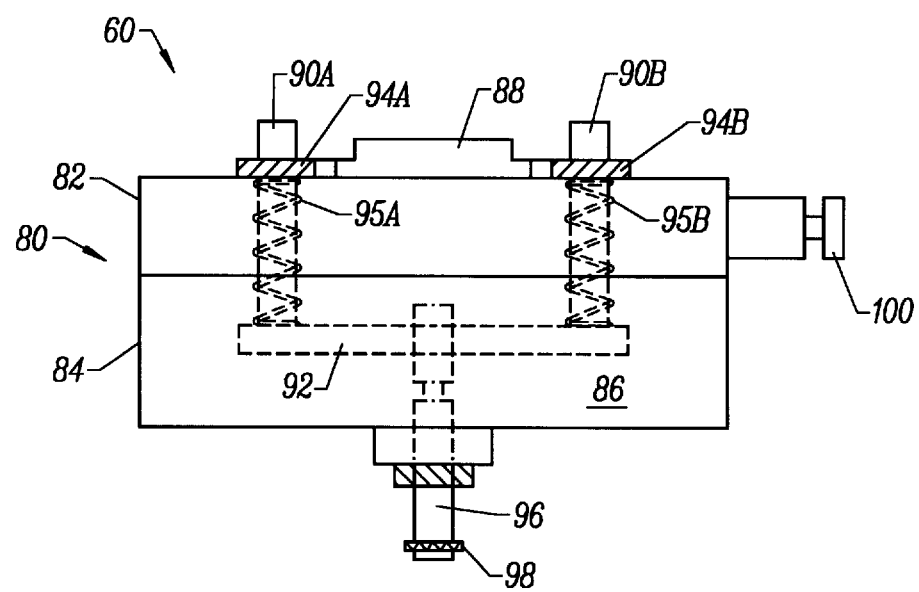
FIG. 3 is a side view of a mounting pedestal in accordance with an embodiment of the invention.

FIG. 3 is a side view of a mounting pedestal 60 which may be used in accordance with the invention. The disclosed embodiment includes a pedestal body 80 with an upper pedestal member 82 and a lower pedestal member 84, which form an interior chamber 86. A pedestal platform 88 is positioned on the upper pedestal member 82. The pedestal platform 88 has associated pedestal posts 90A and 90B which terminate in a pedestal base 92. Pedestal bushings 94A and 94B provide a pneumatic seal within the interior chamber 86. An air cylinder 96 and associated O-ring 98 are used to pneumatically control the pedestal base 92. That is, pneumatic control through the air cylinder 96 is used to extend and retract the pedestal posts 90. FIG. 3 illustrates the pedestal posts 90 in an extended position. This position is typically achieved by forcing air into the air cylinder 96. As will be discussed below, the extended position is used to load an electronic component 14 into a carrier 10. When the pedestal posts 90 are retracted, they no longer engage the clips 20 of the carrier 10, as discussed below. This operation is achieved by venting air from the air cylinder 96. As a result, springs 95 positioned between the pedestal base 92 and the pedestal bushings 94 force the pedestal posts 90 into the interior chamber 86. Tubes and fittings (not shown) between the input/output devices 46 and the air cylinder 96 are used to realize this control action. An air hose fitting 100 may be used for vacuum sense feedback information that is applied to the input/output devices 46.

Figure 4:
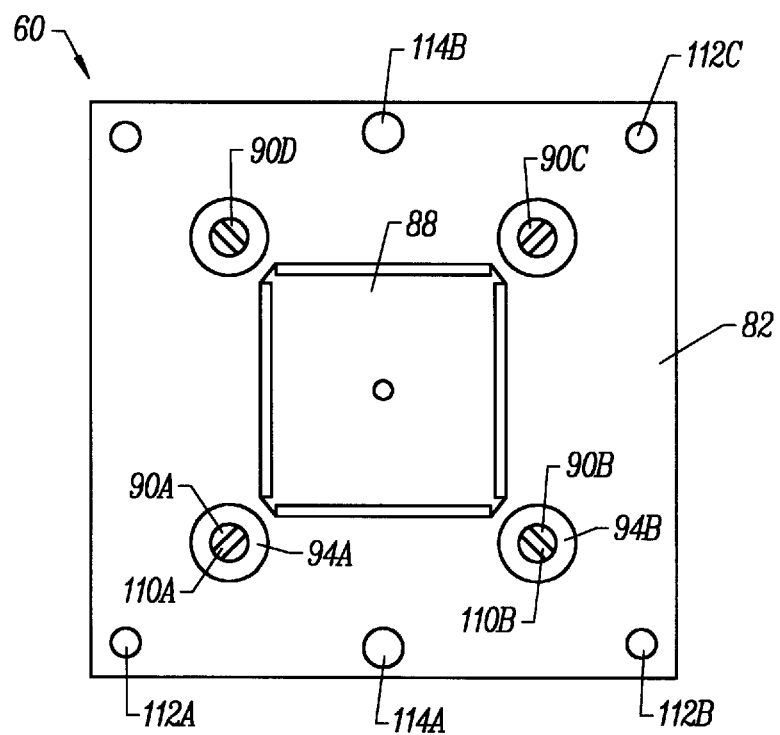
FIG. 4 is a top view of the mounting pedestal of FIG. 3.

FIG. 4 is a top view of the mounting pedestal 60. The figure illustrates the previously described upper pedestal member 82, pedestal platform 88, pedestal posts 90, and pedestal bushings 94. In addition, the figure illustrates that each pedestal post defines a pedestal slot 110. As will be described below, each pedestal post 90 is forced against a clip 20, this results in the clip 20 being pivoted in its pivot notch 26. Thereafter, the clip 20 is lifted through the pedestal slot 110 into a retracted position. This allows an electronic component 14 to be loaded into the carrier 10, as discussed below.

FIG. 4 also illustrates mounting screws 112 for attaching the upper pedestal member 82 to the lower pedestal member 84. Finally, FIG. 4 illustrates guide members 114 which may be used to position the mounting pedestal 60 on the carrier loading apparatus 40.

Figure 5:
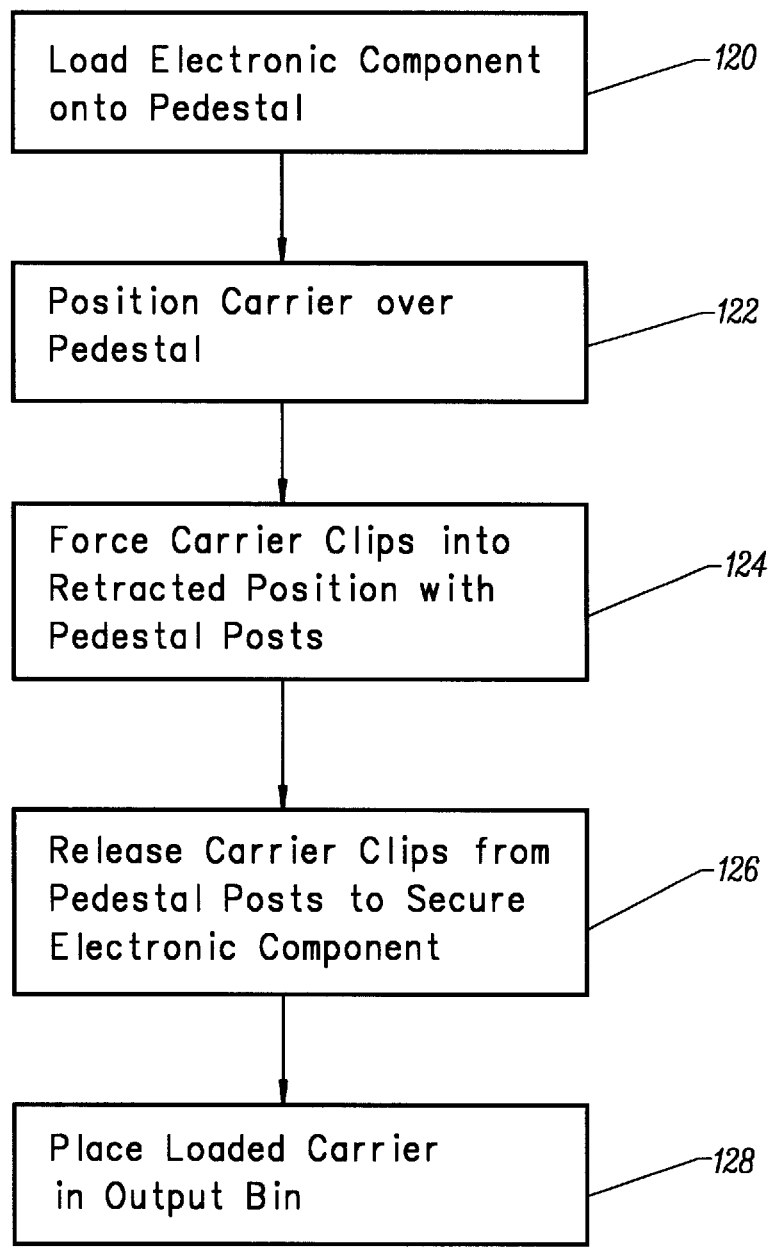
FIG. 5 illustrates processing steps in accordance with an embodiment of the invention.

FIG. 5 illustrates a set of processing steps that may be performed in accordance with an embodiment of the invention. The first processing step is to load an electronic component 14 onto the mounting pedestal 60 (step 120). As indicated above, this step is performed by the electronic component handling mechanism 54 under the control of the computer 44. The next step is to position the carrier 10 over the mounting pedestal 60 (step 122). As indicated above, this operation is performed by the carrier handling mechanism 62 under the control of the computer 44.

Figure 6:
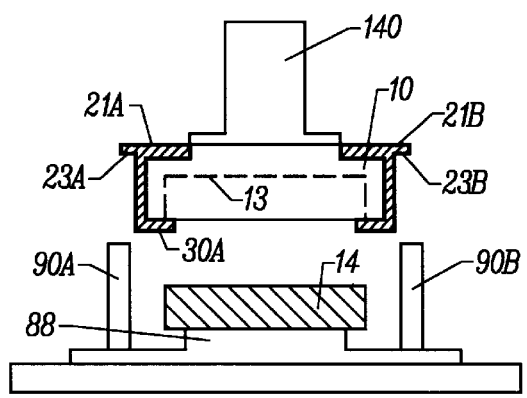
FIG. 6 illustrates the apparatus of the invention before loading of an electronic component into the carrier.

FIG. 6 illustrates an electronic component 14 positioned on the pedestal platform 88 of the mounting pedestal. The figure also illustrates a vacuum wand 140 of the carrier handling mechanism. The vacuum wand 140 is holding a carrier 10, the body of which defines a central aperture 13, shown in phantom. The figure also illustrates two clips 21A and 21B constructed in accordance with an embodiment of the invention. Each clip includes a flange, illustrated as flange 23A on clip 21A and flange 23B on clip 21B.

Figure 7:
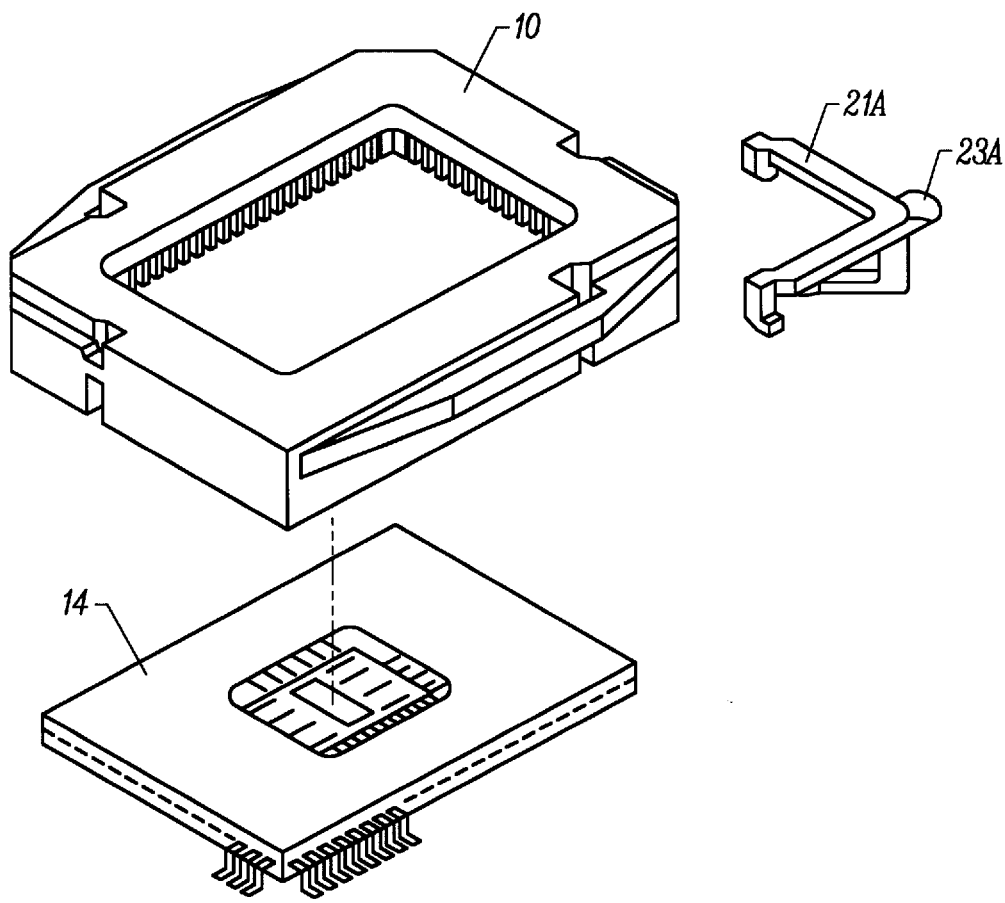
FIG. 7 is a perspective view corresponding to FIG. 6.

FIG. 7 is a perspective view showing some of the elements of FIG. 6. In particular, FIG. 7 illustrates an electronic component 14 and a carrier 10. Further, the figure illustrates a clip 21 A and its associated flange 23 A.

Figure 8:
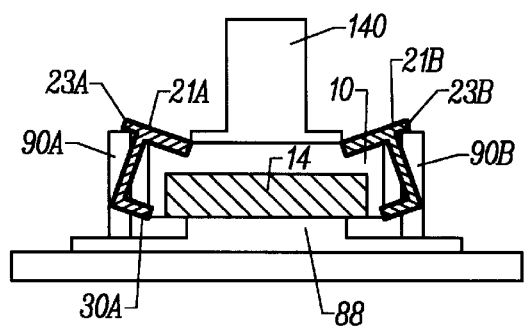
FIG. 8 illustrates the apparatus of the invention during loading of an electronic component into the carrier.

Returning to FIG. 5, the next processing step is to force the carrier clips 21 into a retracted position using the pedestal posts (step 124). This operation is shown in FIG. 8. Note that each pedestal post 90 engages the flange 23 of a clip 21. Thus, as the vacuum wand 140 presses the carrier 10 closer to the electronic component 14, the clip 21 is forced into a retracted position. In particular, the clip 21 pivots in the pivot notch 26 of the carrier 10. As a result, the clip is forced into the slot 110 of the post 90, as shown in FIG. 8. This operation clears the clamping pin 30 from the bottom surface of the carrier 10, allowing the electronic component 14 to be loaded into the carrier 10.

Figure 9:
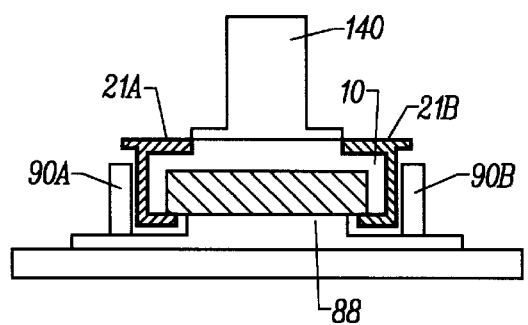
FIG. 9 illustrates the apparatus of the invention immediately after loading of an electronic component into the carrier.

The next processing step shown in FIG. 5 is to release the carrier clips from the pedestal posts to secure the electronic component (step 126). This function may be performed by retracting the pedestal posts 90. FIG. 9 shows the pedestal posts 90 partially retracted. As discussed in relation to FIG. 3, the pedestal posts 90 may be set in an extended position by creating large pneumatic pressure in the air cylinder 96. Then, by releasing the pressure, spring action on the pedestal base 92 will retract the pedestal posts 90. Note in FIG. 9 that the clamping pin 30 of each clip 20 is locked beneath the electronic component 14, thereby securely holding the electronic component 14.

Figure 10:
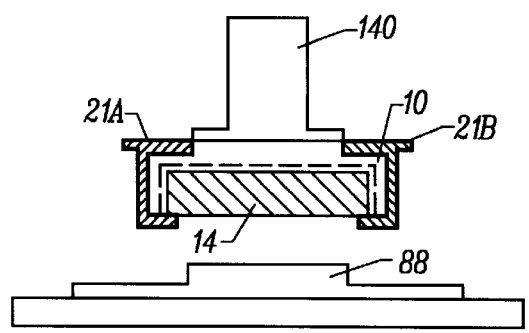
FIG. 10 illustrates the apparatus of the invention handling a carrier after an electronic component has been loaded into it.

The final processing step of FIG. 5 is to place a loaded carrier into an output tray (step 128). FIG. 10 illustrates the lifting of the loaded carrier 10 away from the pedestal platform 88. As discussed above, the carrier handling mechanism 62 places the loaded carrier 10 onto the output tray 66.

The method of the invention provides an improved technique for loading electronic components into a carrier. The automated technique is less susceptible to electronic component damage than prior art manual loading operations. In addition, the automated technique is much faster than prior art manual loading operations. Advantageously, the technique is compatible with existing carrier devices.

Alternate embodiments of the invention are readily appreciable. For example, the carrier handling mechanism 62 may remain stationary while the pedestal posts 90 are extended and retracted. This operation is interchangeable with the operation of using the carrier handling mechanism 62 to push against the pedestal posts 90.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of loading an electronic component into a carrier, said method comprising the steps of:

setting an electronic component onto a pedestal including a pedestal post;

positioning a carrier over said pedestal, said carrier including a clip;

forcing said pedestal post against said clip such that said clip is in a retracted position that allows said electronic component to be positioned in said carrier; and removing said pedestal post from said clip so that said electronic component is secured in said carrier by said clip.

2. The method of claim 1 wherein said setting step includes the steps of:

lifting said electronic component from an electronic component tray; and transporting said electronic component to said pedestal.

3. The method of claim 1 wherein said positioning step includes the steps of:

lifting said carrier from a carrier tray; and transporting said carrier to a position over said pedestal.

4. The method of claim 1 wherein said forcing step includes the step of pushing said carrier against said pedestal post.

5. The method of claim 4 wherein said removing step includes the step of retracting said pedestal post from said carrier.

6. An apparatus for loading an electronic component into a carrier, comprising:

a pedestal including a pedestal post;

an electronic component handling mechanism to set an electronic component onto said pedestal; and a carrier handling mechanism to interact with said pedestal post to force a clip of a carrier against said pedestal post such that said clip is in a retracted position, allowing said electronic component to be loaded into said carrier.

7. The apparatus of claim 6 wherein said pedestal post defines a slot through which said clip can pass when said clip is in said retracted position.

8. The apparatus of claim 7 further comprising means for retracting said pedestal post from said carrier such that said electronic component is secured in said carrier by said clip.

9. The apparatus of claim 6 wherein said pedestal includes a pedestal platform positioned on an upper pedestal member.

10. The apparatus of claim 9 wherein said pedestal includes a lower pedestal member connected to said upper pedestal member, said upper pedestal member and said lower pedestal member defining a void.

11. The apparatus of claim 10 wherein said pedestal includes a pedestal base within said void, said pedestal base supporting said pedestal.

12. The apparatus of claim 11 wherein said pedestal includes a biasing mechanism to force said pedestal base in a first direction and a control mechanism to force said pedestal base in a second direction opposite said first direction.

13. The apparatus of claim 12 wherein said biasing mechanism is a spring and said control mechanism is an air cylinder.

14. The apparatus of claim 13 wherein said pedestal includes a plurality of pedestal posts supported on said pedestal platform.

15. The apparatus of claim 14 wherein said pedestal includes pedestal bushings surrounding said pedestal posts.

16. The apparatus of claim 6 wherein said electronic component handling mechanism and said carrier handling mechanism each include a vacuum wand.

17. The apparatus of claim 6 further comprising a computer to control the operation of said electronic component handling mechanism and said carrier handling mechanism.

18. An apparatus for loading an electronic component into a carrier, comprising:

a pedestal including a plurality of pedestal posts, each of which defines a pedestal slot;

an electronic component handling mechanism to set an electronic component onto said pedestal; and a carrier handling mechanism to interact with said pedestal posts to force a set of clips of a carrier against said pedestal posts such that said clips are in a retracted position in said pedestal slots, allowing said electronic component to be loaded into said carrier.

19. The apparatus of claim 18 further comprising means for retracting said pedestal posts from said carrier such that said electronic component is secured in said carrier by said clip.

20. The apparatus of claim 18 wherein said carrier handling mechanism lifts said carrier with said electronic component loaded therein from said pedestal.

21. The apparatus of claim 18 wherein said electronic component handling mechanism and said carrier handling mechanism each include a vacuum wand.

* * * * *